United States Patent [19]

McLellan et al.

[11] Patent Number: 5,568,415
[45] Date of Patent: Oct. 22, 1996

[54] CONTENT ADDRESSABLE MEMORY HAVING A PAIR OF MEMORY CELLS STORING DON'T CARE STATES FOR ADDRESS TRANSLATION

[75] Inventors: Edward J. McLellan, Milford; Bruce A. Gieseke, Ashland, both of Mass.

[73] Assignee: Digital Equipment Corporation, Maynard, Mass.

[21] Appl. No.: 21,510

[22] Filed: Feb. 19, 1993

[51] Int. Cl.$^6$ ............................ G11C 15/04; G06F 12/10
[52] U.S. Cl. ............................ 365/49; 395/435; 395/419; 364/DIG. 1; 365/218
[58] Field of Search ...................................... 395/435, 412, 395/413, 419; 365/49, 189.07, 218

[56] References Cited

U.S. PATENT DOCUMENTS

| | | | |
|---|---|---|---|
| 3,675,215 | 7/1972 | Arnold et al. | 395/497.02 |
| 3,717,848 | 2/1973 | Irvin et al. | 382/294 |
| 3,806,890 | 4/1974 | Smith | 395/435 |
| 4,602,368 | 7/1986 | Circello et al. | 395/435 |
| 4,638,426 | 1/1987 | Chang et al. | 395/421 |
| 4,799,192 | 1/1989 | Wade et al. | 365/49 |
| 4,813,002 | 3/1989 | Joyce et al. | 365/49 |
| 4,831,585 | 5/1989 | Wade et al. | 365/49 |
| 4,879,687 | 11/1989 | Okamoto et al. | 365/49 |
| 5,014,327 | 5/1991 | Potter et al. | 382/220 |
| 5,155,843 | 10/1992 | Stamm et al. | 395/182.03 |
| 5,193,167 | 3/1993 | Sites et al. | 395/490 |
| 5,222,222 | 6/1993 | Mehring et al. | 395/435 |
| 5,319,590 | 6/1994 | Montoye | 365/49 |
| 5,351,208 | 9/1994 | Jiang | 365/49 |
| 5,454,091 | 9/1995 | Sites et al. | 395/413 |

FOREIGN PATENT DOCUMENTS 0496288 7/1992 European Pat. Off. .

OTHER PUBLICATIONS

Patent Abstracts of Japan, vol. 16, No. 404 (P–1410) 26 Aug. 1992 (JP 04–134 792 (Hitachi) 8 May 1992).
Intel product specification, "i860™ 64–Bit Microprocessor," Oct. 1989, pp. 5–1 to 5–72.
Mike Johnson, "System Considerations in the Design of the AM29000," *I.E.E.E. Micro*, (Aug. 1987), No. 4, New York, N.Y., USA., pp. 28–41.
Brian Case, "Software Approach Broadens Options for Virtual Memory," *Electronic Design*, No. 9 (Apr. 1987), Hasbrouck Heights, N.J., U.S.A., pp. 107–113.
Gerry Kane, "MIPS R2000 RISC Architecture," Prentice Hall, Englewood Cliffs, N.J., U.S.A. (1987), pp. 1–1 to A–9.
Fukuda, "Picture Processing Method," 58–121483, Patent Abstract of Japan, vol. 7, No. 234 (p. 230) [1379] Oct. 18, 1983 (application published Jul. 19, 1983).

*Primary Examiner*—Glenn Gossage
*Attorney, Agent, or Firm*—David A. Dagg; Denis G. Maloney; Arthur W. Fisher

[57] ABSTRACT

A content addressable memory has a pair of single-bit memory cells together storing two bits of information representing either an invalid state, a logic zero state, a logic one state, or a don't care state. Each of the memory cells has a pair of transistors. One of the transistors connects a common node to a respective one of a pair of address lines, and another of the transistors connects the common node to a potential of a predefined logic level. Each of the transistors has a gate receiving a logic level of the bit of information stored in a respective memory cell so that one of the transistors is conductive in response to the logic level of the bit of the information when the other of the transistors is not conductive in response to the logic level of the bit of information. Each of the memory cells also includes a transistor connected to the match line and having a gate connected to the common node. The content addressable memory is especially adapted for use in a translation buffer providing variable page granularity. The don't care states permit multiple virtual page numbers to match a single entry storing information for multiple physical pages. The invalid state eliminates the need for a dedicated valid bit in each entry.

7 Claims, 10 Drawing Sheets

| GRANULARITY SIZE | GRANULARITY MASK | DON'T CARE MASK | PHYSICAL ADDRESS |
|---|---|---|---|
| 1 8KB PAGE | 111 | 000000000 | $T_{34}$ ••• $T_9$ $T_8$ $T_7$ $T_6$ $T_5$ $T_4$ $T_3$ $T_2$ $T_1$ $T_0$ $V_{12}$ ••• $V_0$ |
| 8 8KB PAGES | 110 | 000000111 | $T_{34}$ ••• $T_9$ $T_8$ $T_7$ $T_6$ $T_5$ $T_4$ $T_3$ $V_{15}$ $V_{14}$ $V_{13}$ $V_{12}$ ••• $V_0$ |
| 64 8KB PAGES | 100 | 000111111 | $T_{34}$ ••• $T_9$ $T_8$ $T_7$ $T_6$ $T_5$ $T_4$ $T_3$ $V_{18}$ $V_{17}$ $V_{16}$ $V_{15}$ $V_{14}$ $V_{13}$ $V_{12}$ ••• $V_0$ |
| 512 8KB PAGES | 000 | 111111111 | $T_{34}$ ••• $T_9$ $V_{21}$ $V_{20}$ $V_{19}$ $V_{18}$ $V_{17}$ $V_{16}$ $V_{15}$ $V_{14}$ $V_{13}$ $V_{12}$ ••• $V_0$ |

CONTENT ADDRESSABLE MEMORY HAVING A PAIR OF MEMORY CELLS STORING DON'T CARE STATES FOR ADDRESS TRANSLATION

RELATED APPLICATIONS

The translation buffer described in the present application implements the granularity hint mechanism described and claimed in Richard L. Sites et al., U.S. patent application Ser. No. 07/547,600 filed Jun. 29, 1990, and assigned to the assignee of the present application now abandoned in favor of continuation application Ser. No. 08/111,284, filed Aug. 24, 1993 and assigned to the assignee of the present application, and issued on Sept. 26, 1995 as U.S. Pat. No. 5,454,091.

BACKGROUND OF THE INVENTION

1. Field of the Invention

The present invention relates generally to content addressable memories, and more particularly to content addressable memories in which certain bits of a tag are defined as "don't care" bits that are presumed to match corresponding bits of an address applied to the memory. The present invention specifically relates to a content addressable memory having memory cells storing don't care states for address translation.

2. Description of the Background Art

Content addressable memories, or CAMs, are commonly employed by the designers of digital electronics to provide a means for storing binary words, and later comparing a specified binary word to the stored binary words. Typical uses for CAMs include pattern matching memories for optical character recognition, and translation look-aside buffers for digital computers that employ "virtual" memory.

A content addressable memory typically has a plurality of storage locations, and each storage location stores a tag and a data word associated with the tag. When the content addressable memory is addressed with a specified address, each tag is compared to the specified address, and when a match occurs, the data word associated with the matching tag is retrieved and asserted on a data output bus from the memory.

In a content addressable memory of a typical optical character recognition system, a tag is stored in the memory for each possible pattern to be recognized as a character. Each data word is a code representing a specific character, and the code associated with each tag is the code representing the character to be recognized from the pattern represented by the tag.

A translation buffer is often used in a digital computer in order to translate "virtual" addresses to "physical" addresses. The "virtual" addresses are the addresses that are used by a computer program. The "physical" addresses are the addresses that are used by the memory of the computer. In a typical translation buffer, each data word contains a number of the most significant bits of a "physical" address, and the tag associated with the data word is an even greater number of the most significant bits of a "virtual" address that translates to the "physical" address. The translation buffer therefore provides a flexible mapping between the "virtual" addresses and the "physical" addresses. The translation buffer, however, usually is not large enough to store translations of all possible virtual addresses. Therefore, when the translation buffer is addressed with a virtual address, it is possible that none of the stored physical addresses will match the virtual address. When such a translation miss occurs, the required translation is fetched from main memory and loaded into the translation buffer.

In a content addressable memory, the comparison of the specified address and the tags can be performed in various ways, depending on the information represented by the stored addresses. In a translation buffer, a match typically requires an exact match of each bit of the specified address to each corresponding bit in a tag. Moreover, the desirability of high-speed access dictates that the comparisons are performed in parallel, so that each memory cell storing a bit of each tag has a dedicated comparator circuit.

The memory cells for a translation buffer typically are static cells, and each cell has a pair of cross-coupled inverters for retaining memory state. The cross-coupled inverters provide "true" and "complement" versions of a stored bit. The logical outputs of the comparator circuits for each storage location are wired in parallel to a "match" line that runs parallel to a row of memory cells for the storage location. The match line is pulled down when any bit of the tag fails to match its corresponding bit of the specified address. The comparator circuit, for example, includes a first pair of NMOS transistors connected in series between the match line and ground, and a second pair of NMOS transistors connected in series between the match line and ground. True and complement versions of the corresponding specified address bit are supplied by respective "true" and "complement" parallel address lines running perpendicular to the match line. The first pair of NMOS transistors have their gates connected to the true output of the storage cell and complement address line, respectively. The second pair of NMOS transistors have their gates connected to the complement output of the storage cell and the true address line, respectively. Such a construction of a static CAM cell is shown, for example, in FIG. 5 of U.S. Pat. No. 3,806,890 issued Apr. 23, 1974.

For pattern matching applications such as optical character recognition, it is desirable for specified bit positions to be masked from the comparison operation, so that a match between the specified address and a tag does not require a match between these don't care bits. The don't care bits could be specified by a mask applied to the content addressable memory together with the specified address. Various uses for such an "ignore mask" are described, for example, in Potter et al., U.S. Pat. No. 5,014,327. Additional flexibility results by storing information associated with each tag to identify whether each bit in each tag should be presumed to match its corresponding bit of the specified address. The use of such internally-stored don't care masks for optical character recognition is described, for example, in Irvin et al., U.S. Pat. No. 3,717,848 issued Feb. 20, 1973.

Dynamic CAM memory cells are known which incorporate comparison logic and internal storage for a don't care state. Such a dynamic CAM memory cell may employ as few as five MOS transistors, as described in Wade et al., U.S. Pat. No. 4,831,585. Each cell includes two storage transistors connected between a match line and respective ones of two bit lines. Stored potentials are applied to the gates of the storage transistors through write transistors which connect respective gates of the storage transistors to respective ones of the two bit lines. A fifth MOS transistor functions as a directional diode connecting the match line to the storage transistors. A don't care state is stored in the cell when both of the storage transistors are off. Otherwise, one of the storage transistors is on, and the other storage transistors is off, in order to encode a tag bit. A don't care state of a specified address bit, corresponding to an externally-applied don't care mask bit, is applied to the cell by asserting both of the two bit lines low. Otherwise, a specified address bit is applied by setting one of the bit lines high, and the other one of the bit lines low. The specified address bit fails to match an encoded tag bit when the "low" bit line is connected to the match line through the "on" storage transistor.

SUMMARY OF THE INVENTION

In accordance with one aspect of the present invention, there is provided a method of accessing a memory with a one-bit signal. The memory has a pair of single-bit storage locations together storing two bits of information representing either an invalid state, a logic zero state, a logic one state, or a don't care state. The method includes the steps of storing information in the storage locations representing each of the four states, and generating signals indicating a presence or an absence of a match between the stored information and the one-bit signal. A signal indicating an absence of a match is generated in any case when the one-bit signal represents a logic one and the information in the storage locations represents the invalid state. A signal indicating a presence of a match is generated when the one-bit signal represents a logic zero and the information in the storage locations represents the logic zero state. A signal indicating an absence of a match is generated when the one-bit signal represents a logic one and the information in the storage locations represents the logic zero state. A signal indicating an absence of a match is generated when the one-bit signal represents a logic zero and the information in the storage locations represents the logic one state. A signal indicating a presence of a match is generated when the one-bit signal represents a logic one and the information in the storage locations represents the logic one state. A signal indicating a presence of a match is generated in any case when the information in the storage locations represents the don't care state.

By representing the invalid state as a combination of the two bits stored in the single-bit storage locations, it is possible to eliminate the need for storing a dedicated "valid" bit in order to indicate that a storage location or entry in a content addressable memory is valid.

In accordance with another aspect of the present invention, there is provided a content addressable memory for storing information including a "don't care" state, comparing the stored information to address signals asserted on a pair of address lines, and asserting a match signal on a match line when the stored information matches address information asserted on the address lines. The content addressable memory includes a pair of memory cells, and each of the memory cells stores a respective bit of the stored information. Each of the memory cells includes a pair of transistors. One of the transistors connects a common node to a respective one of the address lines, and another of the transistors connects the common node to a potential of a predefined logic level. Each of the transistors has a gate receiving a logic level of the bit of information stored in the memory cell so that one of the transistors is conductive in response to the logic level of the bit of the information when the other of the transistors is not conductive in response to the logic level of the bit of information. Each of the memory cells also includes a transistor connected to the match line and having a gate connected to the common node.

By accessing the content addressable memory cell of the present invention with complementary address bit signals on the two address lines, the two bits stored in the two memory cells can represent an invalid state, a logic zero state, a logic one state, and a don't care state. The content addressable memory also has the advantage that the two memory cells can be physically separated from each other with a minimum increase in wiring. This advantage is particularly useful in order to provide "don't care" states for just a few of the bits of an existing content addressable memory with a minimal disruption of the layout of the existing memory. An example of such a situation is the modification of a translation buffer in order to provide variable page granularity. Variable page granularity permits one storage location or entry in the translation buffer to store address translation, memory protection, and fault information for a specified number of pages.

In accordance with yet another aspect, the present invention provides a method of translating a virtual address to a physical address in a digital computer. The method includes the steps of: (a) storing a virtual page number in a tag store of a storage location of a content addressable memory, storing an associated physical page number in a data word of the storage location, and storing page granularity information as don't care states in the storage location, the don't care states specifying predetermined bits of the virtual page number in the tag store; (b) matching a virtual page number specified by the virtual address to the virtual page number stored in the tag store of the storage location, and based on the don't care states in the storage location, detecting a match between each predetermined bit of the virtual page number stored in the tag store and a corresponding bit of the virtual page number specified by the virtual address, and upon detecting a match between each bit of the virtual page number specified by the virtual address and the virtual page number stored in the tag store of the storage location, retrieving the associated physical page number from the storage location; and (c) determining the physical address from the associated physical page number retrieved from the storage location. The physical address is determined, for example, by selecting for the physical address each of the corresponding bits of the virtual page number specified by the virtual address.

In accordance with a further aspect, the present invention provides a translation buffer for translating a virtual address to a physical address. The translation buffer includes a plurality of storage locations. Each of the storage locations include a tag store for storing a virtual page number and a data store for storing an associated physical page number. The tag store includes comparators for comparing a virtual page number specified by the virtual address to the virtual page number stored in the tag store of each of the storage locations to select the associated physical page number when a match occurs. Moreover, the comparators include comparators responsive to don't care information stored in each of the storage locations. The don't care information specifies bits in the virtual page number stored in the tag store, and the comparators are responsive to the don't care information to indicate matches between the bits specified by the don't care information and the corresponding bits of the virtual page number specified by the virtual address regardless of logic states of the corresponding bits of the virtual page number specified by the virtual address.

BRIEF DESCRIPTION OF THE DRAWINGS

Other objects and advantages of the present invention will become apparent upon reading the following detailed description and upon reference to the drawings, in which:

FIG. 11 is a schematic diagram of a latch cell shown in FIG. 6;

FIG. 12 is a schematic diagram of a memory cell circuit that is replicated for storing bits of the granularity mask and bits of a page table entry as shown in FIG. 6.

While the invention will be described in connection with a preferred embodiment, it will be understood that it is not intended to limit the invention to this particular embodiment. On the contrary, it is intended to cover all modifications, alternatives, and equivalent arrangements as may be included within the scope of the invention as defined by the appended claims.

DESCRIPTION OF THE PREFERRED EMBODIMENT

Figure 1:
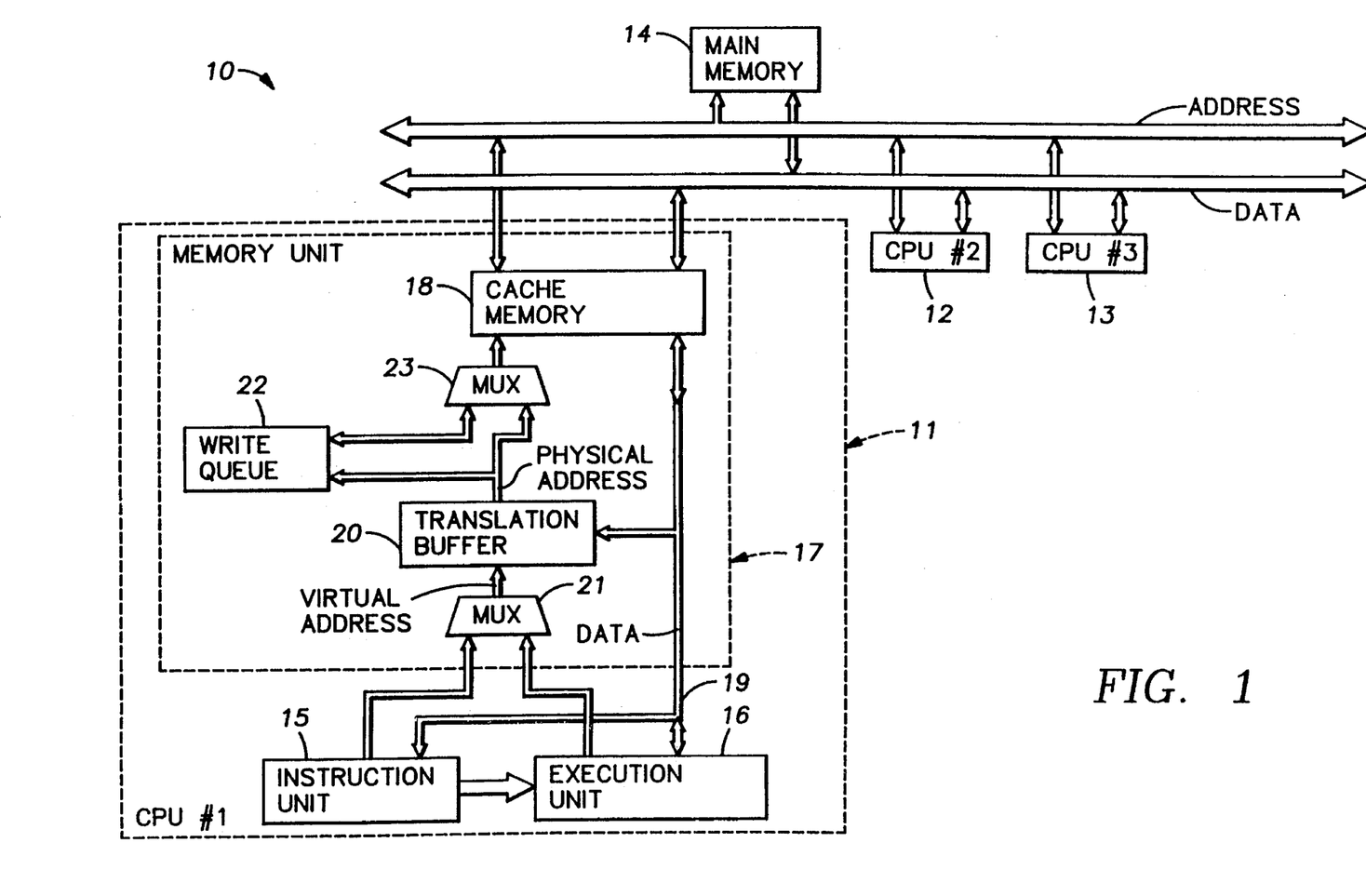
FIG. 1 is a block diagram of a computer system using the content addressable memory of the present invention in a translation buffer of a central processing unit.

Referring now to FIG. 1, there is shown a block diagram of a digital computer system that employs virtual-to-physical address translation. The digital computer system 10 includes a number of central processing units (CPUs) 11, 12, 13 that share a common main memory 14. The central processing unit 11 includes an instruction unit 15, an execution unit 16, and a memory unit 17.

The memory unit 17 includes a cache memory 18 that stores a subset of the data in the main memory 14 in association with the physical memory addresses of the data. When the central processing unit 11 addresses data and the physical address of the data is found in the cache memory 18, then the data are obtained from the cache memory. When the physical address of the data is not found in the cache memory, then the data are fetched from the main memory 14 and loaded into the cache memory 18.

The central processing unit 11 includes an instruction unit 15 that fetches instructions from the cache memory 18 and decodes the instructions to obtain control information and operand specifiers. The instruction unit provides a program counter virtual address to the memory unit 17 in order to fetch instructions from the cache memory 18. The control information and operand specifiers are passed to an execution unit 16 that fetches the specified operands and performs operations upon the operands in accordance with the control information. The specifiers include, for example, register specifiers, memory source specifiers, and memory destination specifiers. The memory source operands are fetched from the cache memory 18 and transferred from the cache memory 18 to the execution unit 16 over a data bus 19. A memory destination specifier specifies a memory address of a location where the execution unit 16 is to store the result of an operation. In this case, the execution unit 16 transmits the result over the data bus 19 to the cache memory 18.

The central processing unit 11 uses a technique known as "virtual addressing" that permits various portions of the main memory space, known as "pages," to be freely allocated to ranges of "virtual" addresses that are used in the computer programs executed by the central processing unit 11. This technique of virtual memory addressing gives the programmer the appearance of a virtual memory space that can be much larger than the amount of physical memory. In a multiprocessing environment, virtual memory addressing may permit different programs executed simultaneously or on a time-shared basis to address the same "virtual" memory addresses without conflict, because different ranges of physical addresses may be mapped to the same virtual address range for the different programs.

For translating the virtual addresses used in a computer program to the physical addresses used in the cache memory 18 and the main memory 14, the memory unit 17 includes a translation buffer 20. As will be more fully described below with reference to FIG. 5, the translation buffer 20 includes a content addressable memory. For the central processing unit 11, as shown in FIG. 1, the translation buffer 20 translates both the instruction addresses from the instruction unit 15 and the operand addresses from the execution unit 16. At any given time, a multiplexer 21 selects a virtual address from either the instruction unit 15 or the execution unit 16, and the selected addresses is translated by the translation buffer 20 to obtain a corresponding physical address. Alternatively, independent translation buffers (not shown) could be used for translating instruction addresses and data addresses.

When the physical address corresponds to a memory destination specifier, the physical address is stored in a write queue 22 until the execution unit 16 places the corresponding result on the data bus 19. A multiplexer 23 selects either the physical address from the translation buffer 20 during a read operation, or a physical address from the write queue 22 for a write operation when the execution unit places a result on the data bus 19. The multiplexer 23 transmits the selected physical address to the cache memory 18.

The present invention concerns the construction of the translation buffer 20, and therefore the central processing unit 11 will not be described in further detail. It should be understood, however, that the translation buffer 20 can be used in a variety of different central processor configurations that employ virtual addressing. The simplest configuration uses a so-called "reduced instruction set computer" (RISC) architecture in which the instruction set for the central processing unit is limited to instructions that are very efficiently executed by the components shown in FIG. 1. An example of a RISC computer employing virtual addressing is described in Richard L. Sites et al., U.S. Ser. No. 07/547,618, filed Jun. 29, 1990, and issued on Mar. 9, 1993, as U.S. Pat. No. 5,193,167, and entitled "Ensuring Data Integrity By Locked-Load And Conditional-Store Operations In A Multiprocessor System", incorporated herein by reference. Alternatively, the central processing unit 11 may execute a so-called complex instruction set, as described in Stamm et al., U.S. Pat. 5,155,843, issued Oct. 13, 1992, and entitled "Error Transition Mode for Multi-Processor System".

Figure 2:
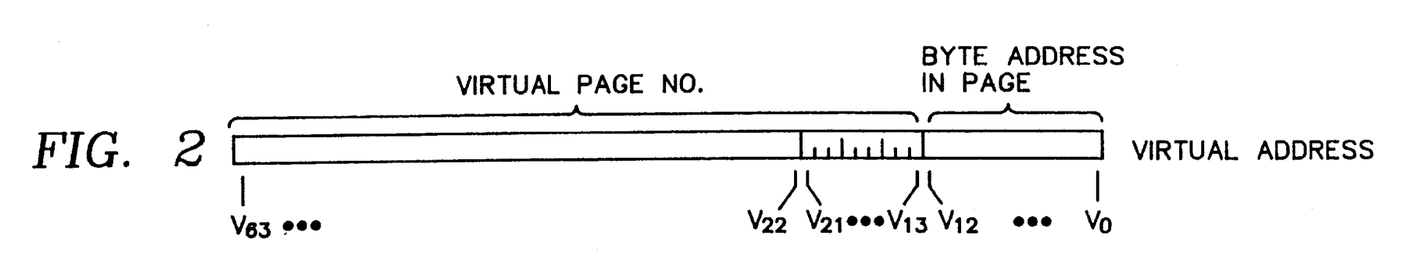
FIG. 2 is a schematic diagram showing various fields that comprise a virtual address as used in the computer system of FIG. 1.

Turning now to FIG. 2, there is shown a schematic diagram of various fields in a virtual address. It is assumed that the virtual address includes sixty-four bits, and the virtual-to-physical address translation employs a "page size" of eight kilobytes. Therefore, the thirteen least significant bits of the virtual address specify a byte address within a page, and the fifty-one more significant bits of the virtual address specify a virtual page number.

Figure 3:
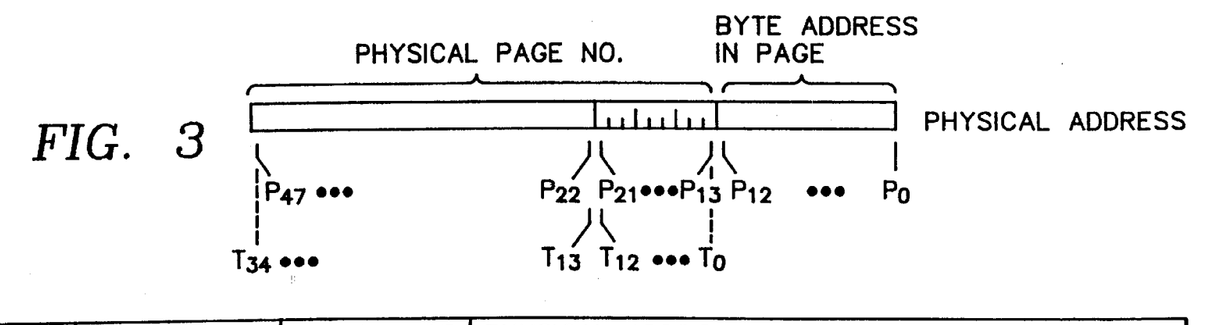
FIG. 3 is a schematic diagram showing various fields of a physical address as used in the computer system of FIG. 1.

Turning now to FIG. 3, there is shown a schematic diagram of various fields in a physical address corresponding to the virtual address format of FIG. 2. A physical address is shown having forty-eight bits. The thirteen least significant bits specify a byte address within an eight kilobyte page. The thirty-five most significant bits of the physical address specify a physical page number.

The page number has significance in the process of translating a virtual address to a physical address, because the byte address within a page is not translated. In other words, for the address formats shown in FIG. 2 and FIG. 3, the thirteen least significant bits ($P_{12} \ldots P_0$) of the physical address have the same logical values as the thirteen least significant bits ($V_{12} \ldots V_0$) of the corresponding virtual address.

The translation buffer of the present invention employs a content addressable memory having "don't care" states for implementing a technique of variable page granularity during virtual-to-physical address translation. The general technique of variable page granularity is described and claimed in the above-referenced Sites et al. U.S. Pat. No. 5,454,091, entitled "Virtual To Physical Address Translation Scheme With Granularity Hint For Identifying Subsequent Pages To Be Accessed." This technique of variable page granularity permits a single entry in the translation buffer (20 in FIG. 1) to translate a group of either 1, 8, 64, or 512 contiguous pages.

The use of a single translation buffer entry for more than one page is advantageous for a large memory structure such as a frame buffer or non-paged buffer pool that can be mapped into contiguous virtual pages with identical memory protection and page fault characteristics. An example of such a mapping is the storage of a video frame for a high-resolution color display; here, the block of data defining one frame may occupy sixty-four eight-kilobyte pages. In this example, by storing the memory protection and page fault information for all sixty-four pages in a single page table entry, it is possible to use a single page table entry for the address mapping of the video frame instead of sixty-four page table entries. This would avoid the occurrence of page faults during multiple references to the video frame buffer for references to a number of pages exceeding the number of entries in the translation buffer 20. A page fault occurs when the translation buffer does not include an entry corresponding to the virtual page number of a virtual address being translated, and such a page fault requires processor time in loading the translation buffer with a new entry.

Figure 4:
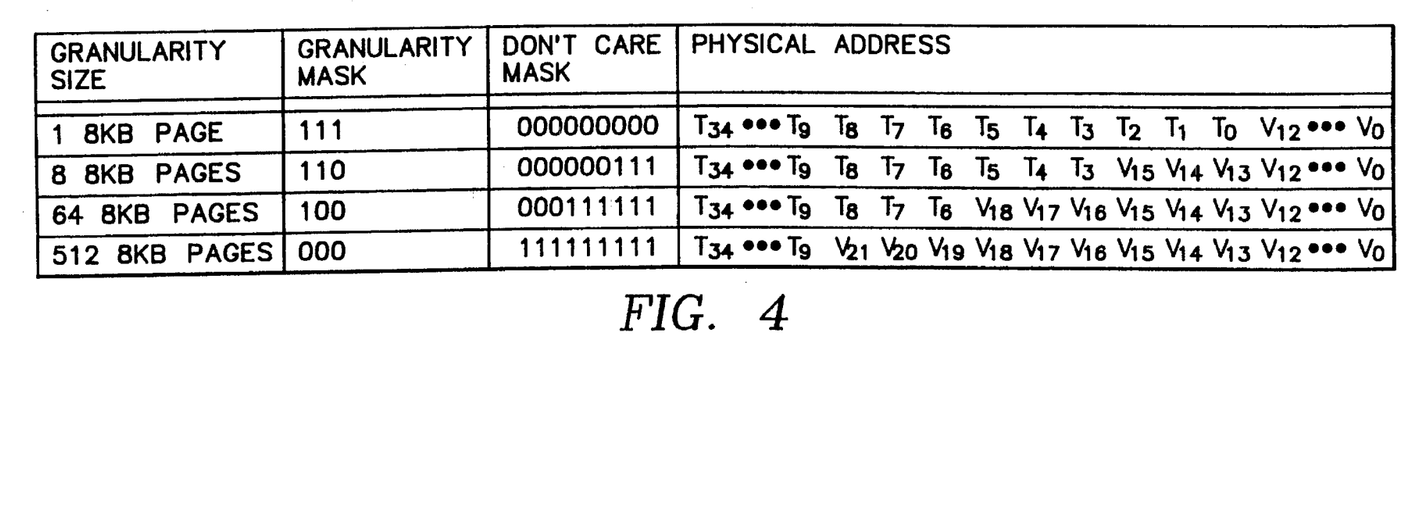
FIG. 4 is a table showing granularity masks, don't care masks, and the contents of the physical address for four different page granularities.

Turning now to FIG. 4, there is shown a table of a granularity mask, a don't care mask, and the content of the physical address for each of four page granularities, including 1, 8, 64, or 512 eight-kilobyte pages per granularity size. A conventional virtual-to-physical address translation corresponds to a granularity size of one page. In this case, the physical address includes bits $T_{34}$ to $T_0$ of the physical page number as translated from the virtual page number, followed by the 13 least significant bits ($V_{12} \ldots V_0$) of the virtual address.

For a granularity size of eight kilobyte pages, bits $P_{15}$, $P_{14}$, \ldots $P_0$ are bits $V_{15}$, $V_{14}$, \ldots $V_0$ of the virtual address. For a granularity size of 64 eight kilobyte pages, bits $P_{18}$, $P_{17}$, \ldots $P_0$ of the physical address are bits $V_{18}$, $V_{17}$, \ldots $V_0$ of the virtual address. For a granularity size of 512 eight kilobyte pages, bits $P_{21}$, $P_{20}$, \ldots $P_0$ of the physical address are $V_{21}$, $V_{20}$, \ldots $V_0$ of the virtual address.

The granularity mask in FIG. 4 is a set of three bits, each indicating whether a corresponding group of three contiguous virtual address bits are translated to obtain the physical address. The least significant bit of the granularity mask indicates whether bits $V_{15}$, $V_{14}$, $V_{13}$ of the virtual address are translated to obtain the corresponding bits $P_{15}$, $P_{14}$, $P_{13}$ of the physical address. The next more significant bit of the granularity mask indicates whether bits $V_{18}$, $V_{17}$, $V_{16}$ of the virtual address are translated to obtain the corresponding bits $P_{18}$, $P_{17}$, $P_{16}$ of the physical address. The most significant bit of the granularity mask has a logical value indicating whether bits $V_{21}$, $V_{20}$, $V_{19}$ of the virtual address are translated to obtain the corresponding bits $P_{21}$, $P_{20}$, $P_{19}$ of the physical address.

Also shown in FIG. 4 is a "don't care" mask having nine bits corresponding to bit positions $V_{21}$, $V_{20}$, \ldots $V_{13}$ of the virtual address. Each bit of the "don't care" mask has a logical zero when its corresponding bit of the virtual address is translated to obtain the physical address, and a value of a logical one when the corresponding bit of the virtual address is not translated in the physical address.

Figure 5:
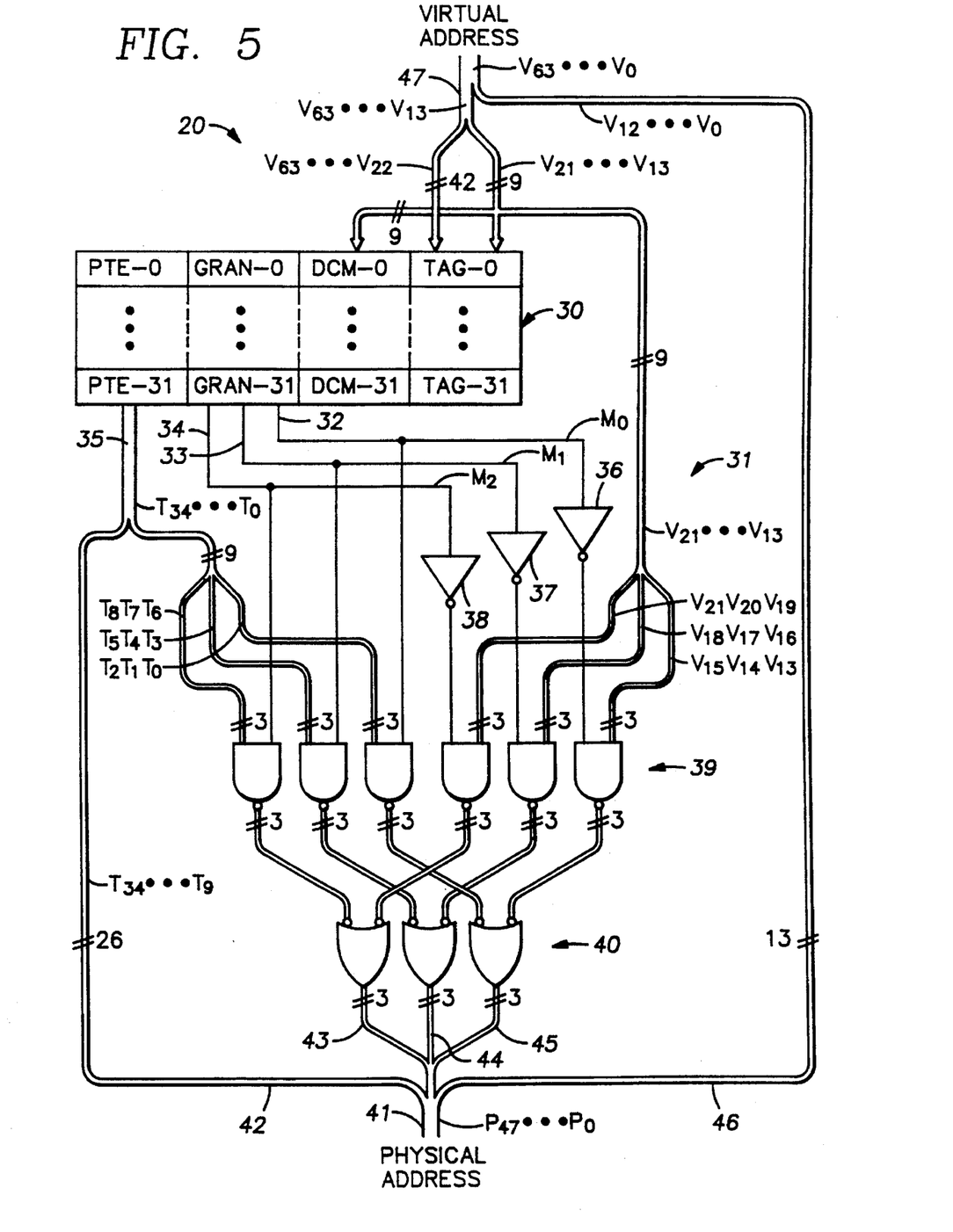
FIG. 5 is a schematic diagram of the translation buffer shown in FIG. 1 and showing a multiplexer that selects bits from either the physical page number retrieved from a storage location or from the virtual page number specified by the virtual address, in accordance with the four granularities shown in FIG. 4.

Turning now to FIG. 5, there is shown a schematic diagram of the translation buffer 20, as shown in FIG. 1, and configured for performing translations with various granularity sizes as shown in FIG. 4. As shown in FIG. 5, the translation buffer 20 includes a content addressable memory generally designated 30 and a multiplexer circuit generally designated 31 that is controlled by the three bits $M_0$, $M_1$, and $M_2$ of the granularity mask.

The content addressable memory 30 includes an array of rows and columns of storage cells. Each row of storage cells includes a contiguous group of cells for storing a page table entry (PTE), the granularity mask (GRAN), an encoded version of the don't care mask (DCM), and a tag (TAG). As will be more fully described below with reference to FIGS. 6 and 9, the information representing the don't care mask (DCM) is encoded in such a way that each memory cell in the "don't care" mask field (DCM) is paired with a corresponding memory cell in the tag field (TAG), and the two bits of each pair of cells represent four states, including an "invalid" state, a state representing a logical zero tag bit, a state representing a logical one tag bit, and a "don't care" state.

In operation, each of the virtual address bits $V_{63}$ to $V_{22}$ specifying the virtual page number is applied to a corresponding memory cell in the tag portion (TAG) of each entry in the content addressable memory 30. Each of the virtual address bits $V_{21}$ to $V_{13}$ is also applied to a corresponding memory cell in the don't care mask portion (DCM) of each entry in the content addressable memory 30. An entry or row in the content addressable memory 30 is selected when there is a match between each of the virtual address bits $V_{63}$ ... $V_{13}$ and the corresponding tag bits stored in the entry. Bits in the positions having the "don't care" states always match regardless of the logic states of the corresponding virtual address bits. Bits in the positions having the "invalid" states never match.

When the content addressable memory 30 has such a matching entry, then the bits in the granularity mask portion (GRAN) of the matching entry are asserted on the output lines 32, 33, 34 and bits in the page table entry (PTE) portion of the matching entry are asserted on an output bus 35. The bits asserted on the output bus 35 include the translated bits $T_{34}$ to $T_0$ that specify the physical page number. The page table entry may include additional fields providing memory protection and page fault characteristics associated with the physical page. An example of such additional fields for providing memory protection and page fault characteristics is disclosed in the above-referenced Richard L. Sites et al., U.S. patent application Ser. No. 07/547,618, filed Jun. 29, 1990, and issued on Mar. 9, 1993, as U.S. Pat. No. 5,193,167, and entitled "Ensuring Data Integrity By Locked-Load And Conditional-Store Operations In A Multiprocessor System".

The multiplexer 31 has three inverters 36, 37, 38 that complement the mask bits $M_0$, $M_1$, and $M_2$ on the output lines 32, 33, 34. The multiplexer 31 further includes a first level of NAND gates 39 and a second level of NAND gates 40. Each of the gate symbols 39 represents three two-input NAND gates, and each two-input NAND gate receives a corresponding one of the virtual or translated bits and a corresponding one of the true or complemented mask bits. Each of the NAND gate symbols 40 represents three two-input NAND gates combining the outputs of two of the NAND gates 39 for a corresponding bit position. The physical address $P_{47}$ ... $P_0$ is obtained on a bus 41 that includes output lines 42 conveying translated bits $T_{34}$ ... $T_9$ from the bus 35; three output lines 43 conveying either translated bits $T_8$ $T_7$ $T_6$ or virtual address bits $V_{21}$ $V_{20}$ $V_{19}$, depending on the most significant granularity mask bit $M_2$; three output lines 44 conveying either translated bits $T_5$ $T_4$ $T_3$ or virtual address bits $V_{18}$ $V_{17}$ $V_{16}$, depending upon the granularity mask bit $M_1$; three lines 45 conveying either translated bits $T_2$ $T_1$ $T_0$ or virtual address bits $V_{15}$ $V_{14}$ $V_{13}$, depending on the least significant granularity mask bit $M_0$; and thirteen lines 46 conveying the virtual address bits $V_{12}$ ... $V_{10}$ from the virtual address bus 47.

Figure 6A:
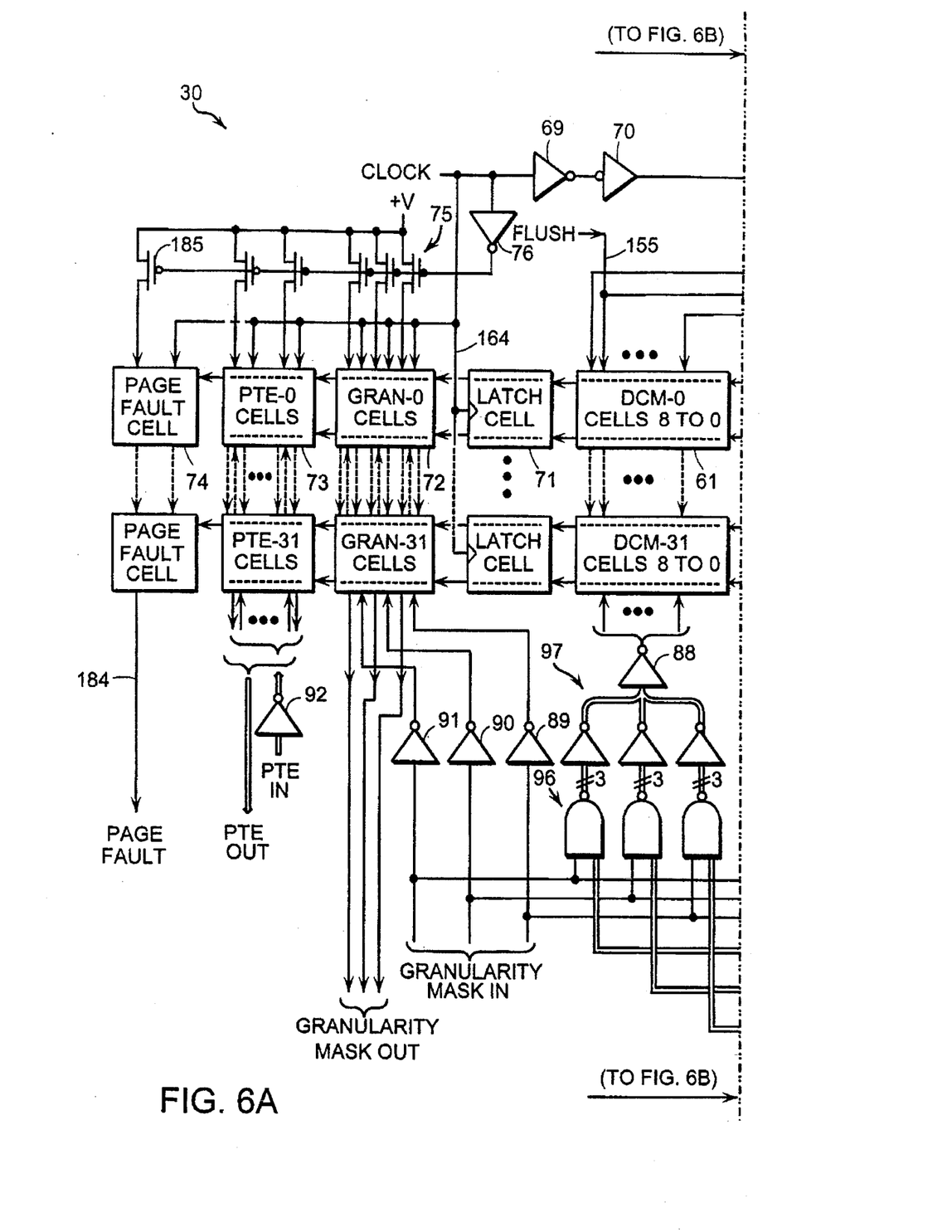
FIG. 6A and 6B together comprise a detailed block diagram of a content addressable memory shown in FIG. 5.
Figure 6B:
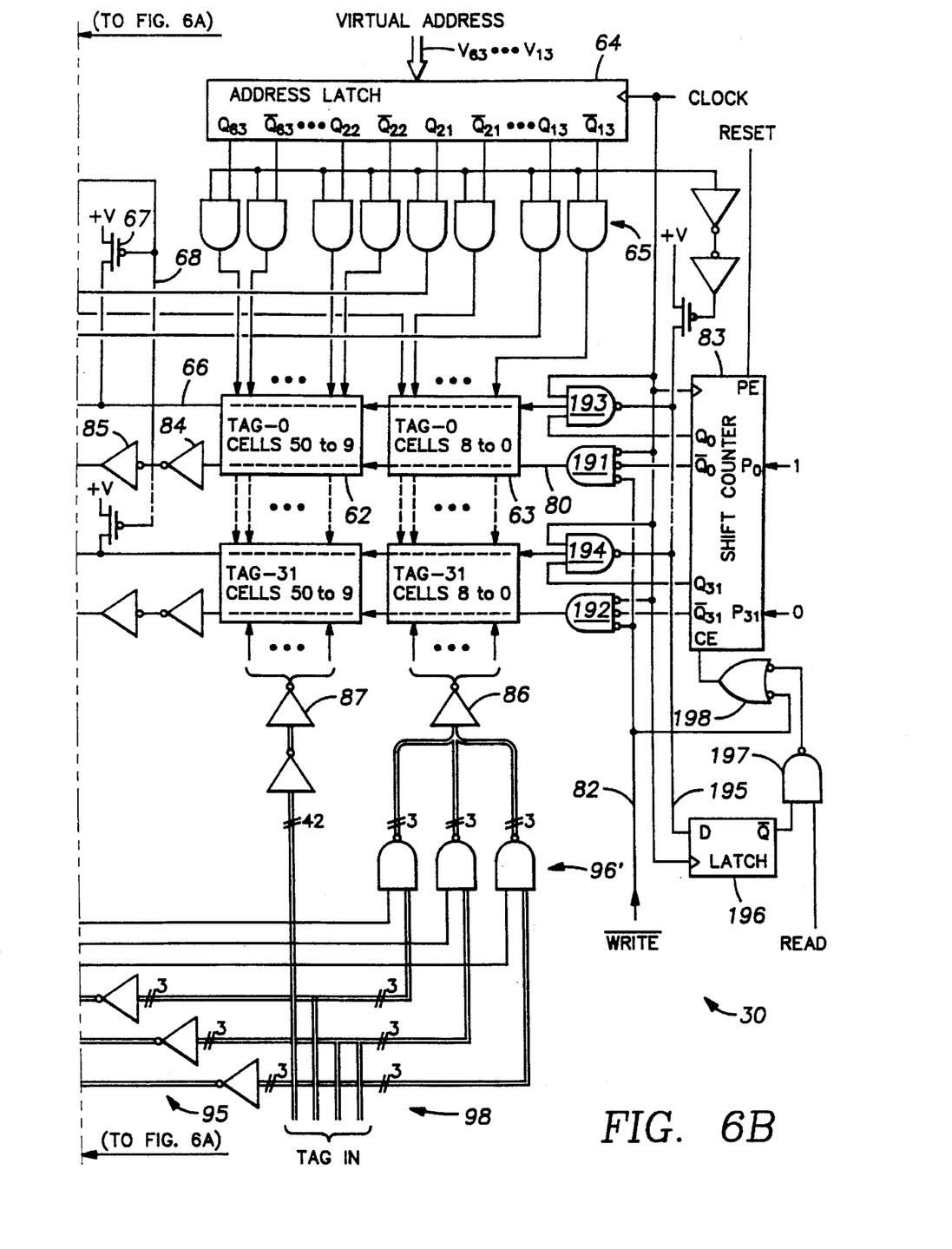

Turning now to FIG. 6A and 6B, there is shown a more detailed schematic diagram of the content addressable memory 30 introduced in FIG. 5. FIGS. 6A and 6B should be placed side-by-side, with 6A on the left and 6B on the right, to view a complete schematic diagram. The content addressable memory 30 includes, for each entry or row, fifty-eight cells which store information encoding the tag bits and the don't care mask. These cells are organized into a contiguous set 61 of nine cells encoding tag bits and don't care bits for virtual address bit positions 21 to 13, a contiguous set 62 of memory cells for storing forty-two tag bits corresponding to virtual address bit positions 63 to 22, and a set 63 of nine contiguous memory cells for storing tag bits encoded with don't care bits for virtual address bit positions 21 to 13.

Virtual address bits $V_{63}$ to $V_{13}$ are applied to the sets of memory cells 61, 62, 63 by an address latch 64 and address bit line drivers generally designated 65 which are gated by a system clock (CLOCK). (FIG. 6B.) Each of the sets of tag memory cells 62 is connected to a pair of bit lines conveying true and complement versions of a buffered address signal for a corresponding one of a virtual address bit. Each of the sets of tag memory cells 61 is connected to a single bit line conveying a buffered true version of a corresponding one of the virtual address bits. (FIG. 6A.) Each of the memory cells 63 is connected to a single one of the bit lines conveying a buffered complement version of a corresponding one of the virtual address bits. (FIG. 6B.)

Each of the memory cells in sets 61, 62, 63 is connected to a match line 66 running parallel to the row of memory cells. The match line 66 is precharged during a second portion of the clock cycle by a PMOS pull-up transistor 67 having its gate connected to a vertical buffered clock line 68 (FIG. 6A) driven by buffers 69 and 70. (FIG. 6A.) The match line 66 extends to a latch cell 71 that latches the state on the match line 66 during the second portion of the clock cycle. (FIG. 6A.) The output of the latch cell 71 enables granularity mask cells 72, page table entry cells 73, and a page fault cell 74 to assert output signals on vertical output lines that are precharged during the first portion of a clock cycle by respective PMOS transistors 75. (FIG. 6A.) The gate of each of the pull-up transistors 75 is enabled by an inverter 76 driven by the clock signal. (FIG. 6A.)

For writing data to an entry of the content addressable memory 30, the data storage cells in each entry or row of the memory are connected to a respective write line, such as the write line 80 for the first row of cells. (FIG. 6B.) As shown in FIG. 6B, the write lines are driven by a column of drivers 191, 192. Each of the drivers 191, 192 asserts a write enable signal on a selected one of the write lines in the later portion of a clock cycle when a write signal is asserted low on a master write line 82. The write line for a selected one of the rows or entries is selected by a shift counter 83 that is incremented during each write operation. The shift counter is also incremented during a read operation when a match occurs for an entry pointed to by the shift counter. In other words, the shift counter 83 selects an entry that is not last used. To determine when a match occurs for an entry pointed to by the shift counter, open-drain NAND gates 193, 194 discharge a precharged line 195, and the logic state on the line 195 is latched by a latch 196 during the second portion of the clock cycle. The complement output of the latch 196 and a read signal $\overline{\text{WRITE}}$ are inputs to a NAND gate 197. The output of NAND gate 197 and the write signal are inputs to a NAND gate 198. The output of NAND gate 198 is used to enable counting by the shift counter 83. Each of the write lines, such as the line 80, has a pair of buffers, such as the buffers 84, 85, disposed in the line in the middle of the row. (FIG. 6B.)

Data to be written to the cells is asserted on vertical data input lines. As shown in FIG. 6B, inverters 86 drive the data input lines to the cells 63, and inverters 87 drive the data input lines to the cells 62. As shown in FIG. 6A, inverters 88 drive the data input lines to the don't care mask cells 61, inverters 89, 90, 91 drive the data input lines to the granularity mask cells 72, and inverters 92 drive the data input lines to the page table entry cells 73.

A don't care mask bit is encoded as a logic one asserted on a data input line to one of the don't care mask cells 61, and a logic zero asserted on the data input line to a corresponding one of the tag cells 63. Logic for this encoding of the don't care mask information is shown in the bottom right-hand corner of FIG. 6A and the bottom of FIG. 6B. This encoding logic includes a set of inverters generally designated 95 (FIG. 6B), a row of NAND gates generally designated 96 (FIG. 6A) and 96' (FIG. 6B), and a set of inverters generally designated 97 (FIG. 6A). The don't care states are encoded when the granularity mask has a logic zero bit for a corresponding set of three contiguous address bit positions. The NAND gates 96 (FIG. 6A) and 96' (FIG. 6B) mask the input data bits of the tag from the data lines 98 (FIG. 6B) with the granularity mask. In particular, respective ones of the NAND gates 96 (FIG. 6A) force the corresponding set of three neighboring data input bits to the cells 61 to a logic one state, and respective ones of the NAND gates 96' (FIG. 6B) force a corresponding group of three data input bits to the tag cell 63 to the logic zero state. When a bit of the granularity mask has a value of logic one, then the data input lines to the memory cells 61, 63 corresponding to the three contiguous address bit positions, have logical values specified by the logical values of the bits in the input tag received on the data input lines 98. (FIG. 6B).

Figure 7:
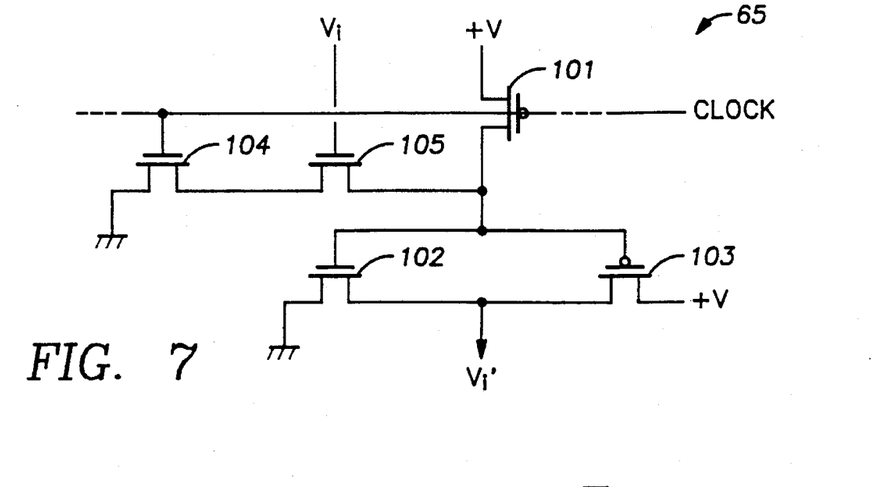
FIG. 7 is a schematic diagram of an address line driver shown in FIG. 6.

Turning now to FIG. 7, there is shown a schematic diagram for one of the address line drivers 65. Buffered address bits $V_i'$ are asserted during the first portion of the clock cycle when the clock is high. During the second portion of the clock cycle, when the clock is low, a PMOS transistor 101 precharges the gates of driver transistors 102, 103. During the first portion of the clock cycle, when the clock is high, the gates of the transistors 102, 103 are discharged by transistors 104, 105 when the address bit $V_i$ is a logic high.

Figure 8:
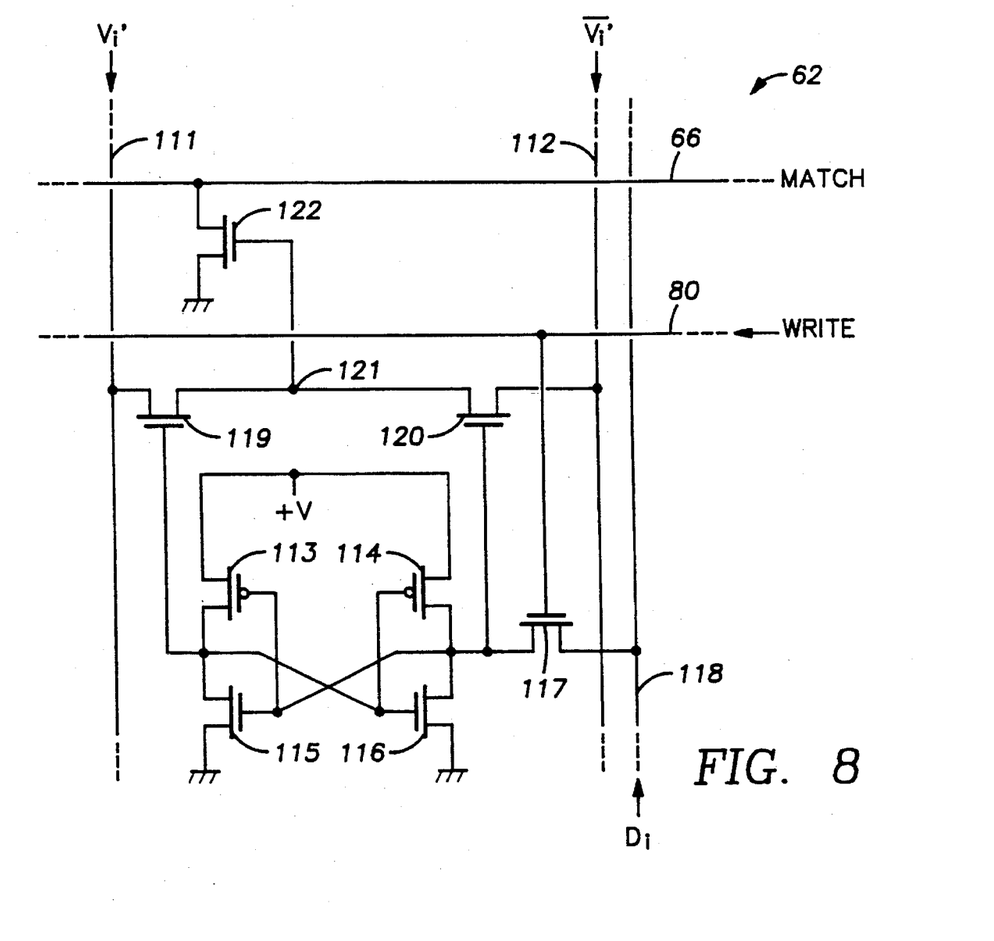
FIG. 8 is a schematic diagram of a content addressable memory cell used for storing a high order bit of a tag.

Turning now to FIG. 8, there is shown a schematic diagram for one of the tag memory cells 62. The tag memory cell 62 is connected to a pair of vertical address bit lines 111, 112 which carry complementary versions of the buffered address bit during the first portion of the clock cycle. The memory cell 62 includes a static memory element including two PMOS transistors 113, 114 and two NMOS transistors 115, 116, which are wired together to form a pair of cross-coupled inverters. During a write operation, a write signal asserted on the write line 80 enables an NMOS transistor 117 to force the transistors 113, 114, 115, 116 to a logic state asserted on a data input line 118.

The memory cell 62 has an associated comparator including a pair of NMOS transistors 119, 120, each connecting a respective one of the address bit lines 111, 112 to a common node 121. The transistors 119, 120 are gated by complementary logic signals from the storage transistors 113, 114, 115, 116. Assuming that the logic state on the gate of the transistor 120 is defined as the logic state stored by the storage transistors 113 to 116, then the logic signal at the node 121 is the exclusive-OR of the buffered virtual address bit $V_i'$ and the logic state of the storage transistors. The node 121 is connected to the gate of an NMOS transistor 122 performing a wired NOR function on the match line 66. Therefore, the match line 66 is pulled down by the transistor 122 whenever the buffered virtual address bit $V_i'$ fails to match the logic state of the storage transistors 113 to 116.

Figure 9:
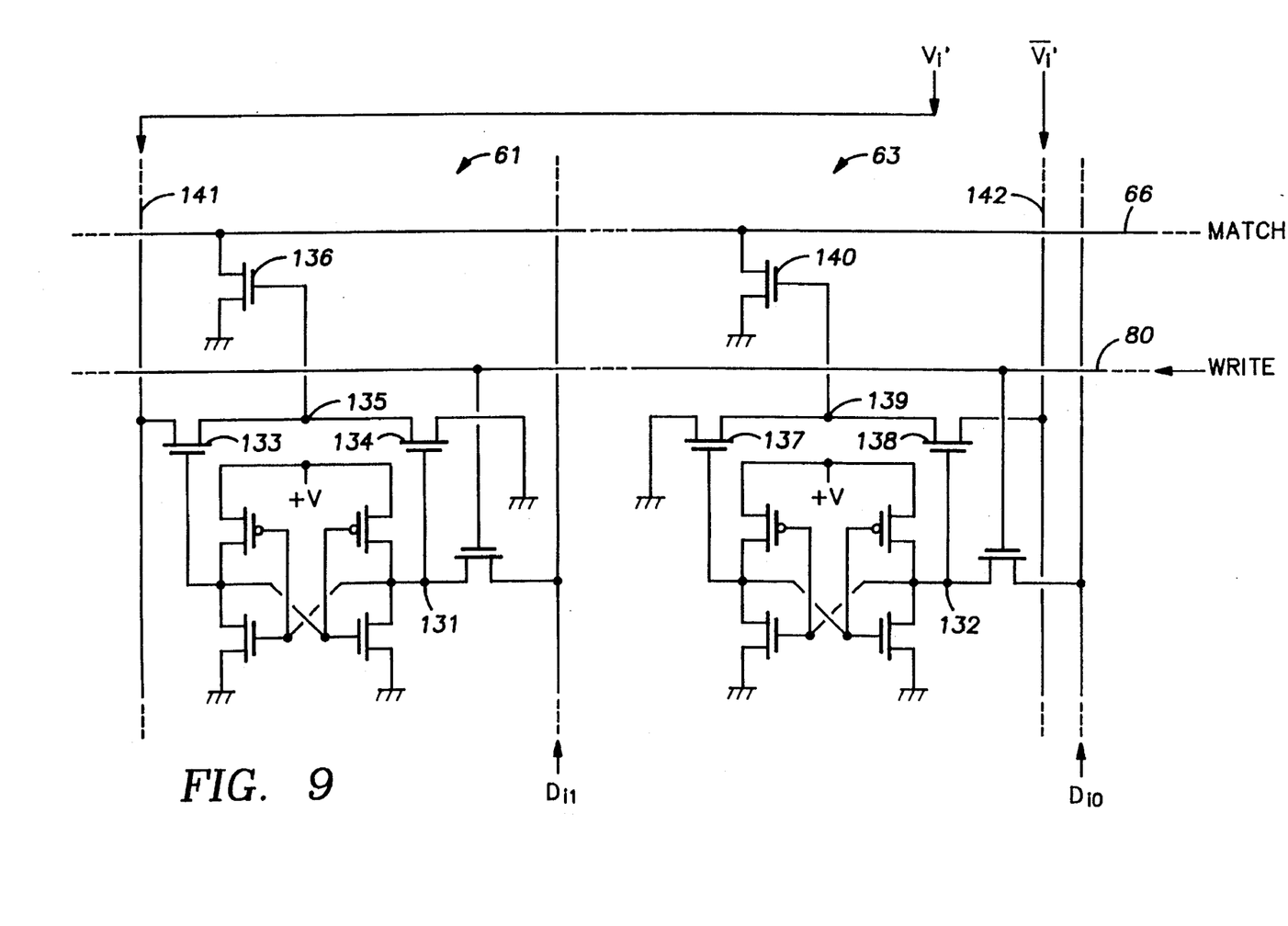
FIG. 9 is a schematic diagram of a pair of content addressable memory cells used for storing a low order bit of a tag and also encoding a don't care state.

Turning now to FIG. 9, there is shown a schematic diagram of one of the mask storage cells 61 and its corresponding one of the tag memory cells 63. The pair of cells 61, 63 defines four states for a corresponding tag bit, and these four states include an invalid state, a logic zero state, a logic one state, and a don't care state. In accordance with the convention introduced above with respect to FIG. 8, the logic state of the memory cell 61 will be the stored logic signal on a node 131, and the logic state of the memory cell 63 will be the logic state on a node 132.

The don't care state is encoded by a logic one stored in the cell 61, and a logic zero stored in the cell 63. In this case, in the cell 61, a transistor 133 will be off, and a transistor 134 will be on, so that the logic state at a common node 135 is a logic zero, and therefore an output transistor 136 connected to the match line 66 will be off, and the cell 61 will indicate a match, and in a similar fashion, in the cell 63, a transistor 137 is on, and a transistor 138 is off, so that a common node 139 is at a low logic state and an output transistor 140 is off, so that the cell 63 also indicates a match.

The pair of memory cells 61, 63 encode a logic zero state for the tag bit when both of the memory cells 61, 63 store a logic zero. In this case, the cell 61 senses a match or a mismatch between the stored tag bit and the buffered virtual address bit $V_i'$ and the memory cell 63 always indicates a match.

The pair of memory cells 61, 63 store a logic one state for the tag bit when each of the memory cells 61, 63 store a logic one. In this case, the memory cell 61 always indicates a match and the memory cell 63 indicates whether or not the tag bit matches the buffered virtual address bit $V_i'$.

The invalid state is encoded by a logic zero stored in the memory cell 61, and a logic one stored in the corresponding memory cell 63. In this case, both the transistor 133 of the cell 61 and the transistor 138 of the cell 63 will be on, so that one of the nodes 135 or 139 will be a logic one, because address lines 141, 142 convey complementary address bit signals. Therefore, either the transistor 136 or the transistor 140 will pull down the match line 66 and indicate a miss-match condition. This miss-match condition will cause the entire row or entry in the content addressable memory (30 of FIG. 6) to never be selected, as if it were an invalid entry.

A conventional translation buffer has a one-bit storage location for each entry to indicate whether or not the entry is valid. Moreover, there are provided means for "flushing" the translation buffer by simultaneously clearing the valid bits for all of the entries. The translation buffer, for example, is flushed during a "context switch" prior to the beginning or resumption of execution of a computer program.

Figure 10:
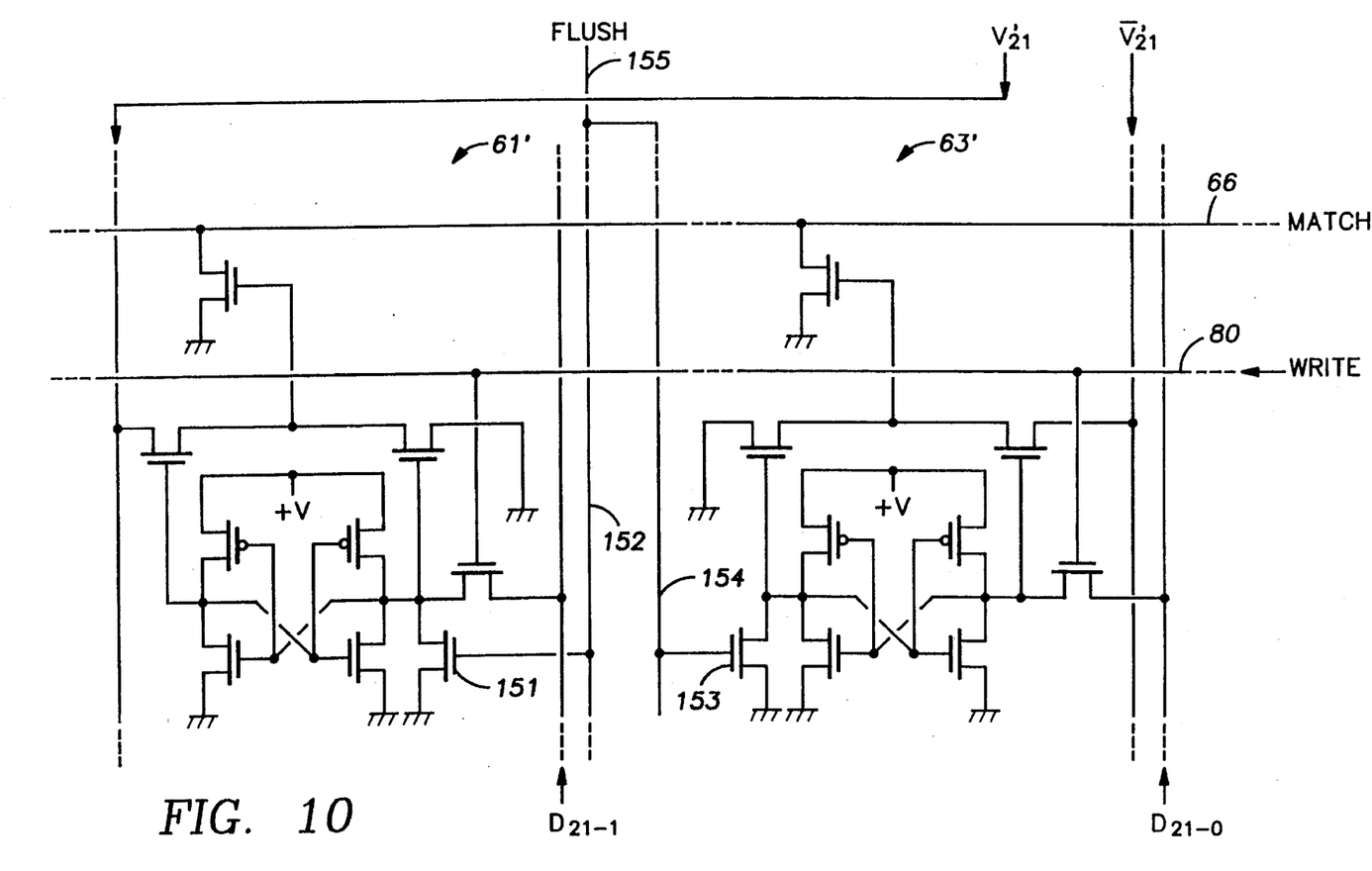
FIG. 10 is a modification of the memory cells of FIG. 9, for setting the stored information to an invalid state in response to a flush signal.

Turning now to FIG. 10, there is shown a schematic diagram for using any one of the pairs of cells as shown in FIG. 9 to perform the function of a valid bit by including means for setting such a pair of cells for each entry to the invalid state. A comparison of FIG. 9 to FIG. 10 shows that the "flushing means" includes at least one vertical flush line and one transistor for each cell. As shown in FIG. 10, the cell 61' has a transistor 151 having a gate connected to a flush line 152, and the cell 63' has a transistor 153 having a gate connected to a flush line 154. When a logic one or a high is asserted on the flush line, the transistor 151 becomes conductive and forces the memory cell 61 to a logic zero state, and the transistor 153 becomes conductive and forces the memory cell 63 to a logic one state. Therefore, the pair of cells 61', 63' become set to an invalid state which guarantees that one of the cells 61, 63 will pull down the match line 66 so that the entry including the cells 61', 63' will not be selected For the circuit as shown in FIGS. 6A and 6B, the mask cells 61 and the tag cells 63 for the virtual address bit position 21 in each row are configured as shown in FIG. 10 and connected to a flush line 155 for flushing or invalidating all of the entries in the content addressable memory 30.

Turning now to FIG. 11, there is shown a schematic diagram of the latch cell 71. The latch cell includes two cross-coupled NAND gates 161, 162 which form a set-reset flip-flop. The match line 66 is connected to one input of the NAND gate 161, and the match line is also connected to one input of a NAND gate 163 having an output connected to an input of the NAND gate 162. The other input of the NAND gate 163 receives the clock signal on a vertical clock line 164. The latch circuit 71 differs from a conventional latch circuit, because the input to the NAND gate 161 that receives the match line 66 is not gated with the clock. The match input to the gate 161 need not be gated by the clock, because the precharge state of the match line is a logic high so that the latch 71 will retain any miss-match condition, so long as the clock is low.

Turning now to FIG. 12, there is shown a schematic diagram of a data storage cell used for the granularity mask cells 62 and for the page table entry cells 73. The memory cell includes two PMOS transistors 171, 172 and two NMOS transistors 173, 174 wired together to form two cross-coupled inverters. These storage transistors 171, 172, 173, 174 are connected through an NMOS transistor 175 to a data input line 176 to receive a bit of input data when the transistor 175 is turned on by a write pulse on a write line 80'. A bit of data is read out of the cell onto an output line 177 when a match signal is asserted low on the latched match line 165 and when the clock line is low. A NOR gate 178 has inputs connected to the latched match line 165, a clock line 179, and the inverted data output of the storage cell consisting of the four storage transistors 173 to 174. The NOR gate 178 has an output connected to a gate of a transistor 180 connecting the output line 177 to the substrate ground. The output line 177 is precharged by a pull-up transistor 181 (one of the transistors 75 in FIG. 6A) during the first portion of the clock cycle. Therefore, data is asserted on the output line 177 during the second portion of the clock cycle when there is a match of the tag for the entry including the cell shown in FIG. 12.

Figure 13:
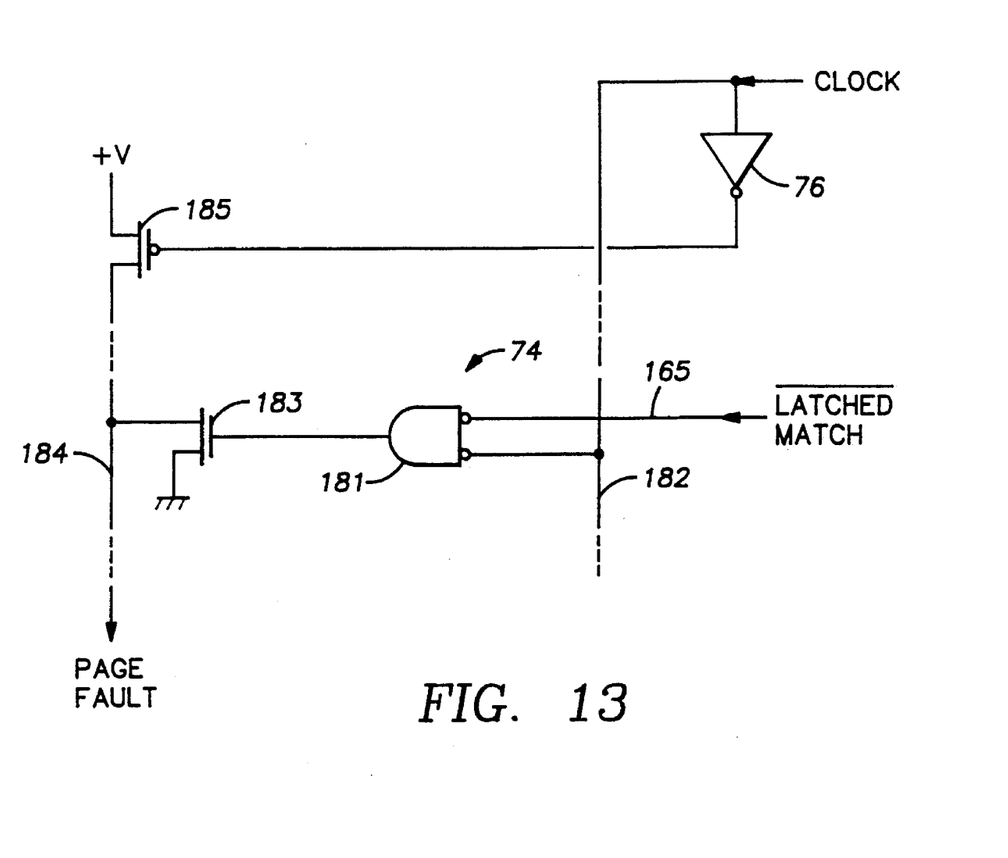
FIG. 13 is a schematic diagram of a fault cell used for inhibiting the generation of a page fault signal when a match is detected.

Turning now to FIG. 13, there is shown a schematic diagram of the page fault cell 74. The page fault cell 74 includes a NOR gate 181 having one input receiving the latched match line 165, and another input receiving the clock on a clock line 182. The output of the NOR gate 181 is connected to the gate of an NMOS transistor 183 connecting a page fault line 184 to the substrate ground. During the first portion of the clock cycle, a transistor 185 (one of the transistors 75 in FIG. 6A) precharges the line 184 to a logic high. During the second portion of the clock cycle, the clock enables the NOR gate 181 which drives the NMOS transistor 183 to turn on when there is a match for the tag corresponding to the entry including the page fault cell 74. The page fault line 184 runs vertically and is connected to a page fault cell for each entry or row of the content addressable memory (30 in FIG. 6). Therefore, when the page fault line 184 fails to be pulled down by any of the page fault cells during the second portion of the clock cycle, none of the tags have matched the address applied to the memory and the page fault condition is indicated by the logic high on the page fault line 184.

In a conventional fashion, the page fault signal is used by the execution unit (16 in FIG. 1) to cause execution of a page fault handling routine that addresses a page table in the cache memory 18 or main memory 14 to obtain a new entry for the content addressable memory 30. The new entry is transferred from the data bus (19 in FIG. 1) to the data inputs of the memory 30 and loaded into the entry of the content addressable memory 30 specified by the shift counter 83, when the execution unit 16 asserts a write signal on the master write control line (82 in FIG. 6B).

In view of the above, there has been described a translation buffer using a content addressable memory storing don't care information for the least significant bits of a virtual page number. The don't care information permits multiple virtual page numbers to match a tag in a single entry storing information about a group of multiple contiguous physical pages. Preferably the don't care information for each bit of the least significant bits of the virtual page number is encoded as one of four states of a pair of single-bit memory cells. Another of the four states is an invalid state. One of the pairs of single-bit memory cells in each entry can be set to the invalid state in order to flush the translation buffer. A preferred construction for the memory cells has been described that permits the two single-bit memory cells in each pair to be physically separated with a minimal increase in wiring.

We claim:

1. A content addressable memory for storing information including a "don't care" state, comparing the stored information to address signals asserted on a pair of address lines, and asserting a match signal on a match line when the stored information matches address information asserted on said address lines, said content addressable memory comprising:

a pair of memory cells, each of said memory cells storing a respective bit of said stored information, each of said memory cells including a pair of transistors, one of said transistors connecting a common node to a respective one of said address lines, another of said transistors connecting said common node to a potential of a predefined logic level, each of said transistors having a gate receiving a logic level or inverted logic level of the bit of information stored in a respective one of said memory cells so that one of said transistors is conductive in response to the logic level of the bit of information stored in the respective one of said memory cells when the other of said transistors is not conductive in response to the logic level of the bit of information stored in the respective one of said memory cells; and a transistor connected to said match line and having a gate connected to said common node.

2. The content addressable memory as claimed in claim 1, wherein said potential of a predefined logic level is ground potential of a semiconductor substrate including semiconductor material of said transistors.

3. The content addressable memory as claimed in claim 1, further comprising an address bit generator connected to said address lines to assert complementary address signals on said address lines.

4. The content addressable memory as claimed in claim 1, wherein each of said memory cells includes a pair of cross-coupled inverters for storing a respective bit of said stored information, one of said inverters having an output connected to the gate of said one of said pair of transistors, and the other of said pair of inverters having an output connected to the gate of said other of said pair of transistors, so that complementary logic levels are asserted on the gates of the transistors of said pair of transistors.

5. The content addressable memory as claimed in claim 1, wherein each of said memory cells further comprises a transistor having a gate connected to a flush line for setting, in response to a flush signal on said flush line, the bit of information stored in a respective memory cell to a logic state rendering said one of said pair of transistors non-conductive.

6. The content addressable memory as claimed in claim 5, further comprising a write line and pair of data input lines, and wherein each of said memory cells further comprises a transistor connected to a respective one of said data input lines and having a gate connected to said write line for setting a respective bit of information to a logic state specified by a data signal asserted on said respective one said data input lines when a write enable signal is asserted on said write line.

7. The content addressable memory as claimed in claim 6, further comprising a logic circuit connecting said pair of data input lines to a single data line of a data bus and to a mask bit line so that when a mask bit is asserted on said mask bit line and a write enable signal is asserted on said write line, data are written into said pair of memory cells representing said "don't care" state, and when a mask bit is not asserted on said mask bit line and a write enable signal is asserted on said write line, data are written into said pair of memory cells.

* * * * *